(12) United States Patent
Mizukoshi (10) Patent No.: US 6,896,998 B2
(45) Date of Patent: May 24, 2005

(54) PATTERN FORMING METHOD (75) Inventor: Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 217 days.

(21) Appl. No.: 10/320,398

(22) Filed: Dec. 17, 2002

(65) Prior Publication Data
US 2003/0124868 A1 Jul. 3, 2003

(30) Foreign Application Priority Data

Dec. 18, 2001 (JP) ........................................ 2001-384297

(51) Int. Cl.$^7$ .............................. G03F 9/00; G03C 5/00
(52) U.S. Cl. ................................ 430/22; 430/5; 430/30
(58) Field of Search ................................ 430/5, 22, 30

(56) References Cited

U.S. PATENT DOCUMENTS 6,251,550 B1 * 6/2001 Ishikawa ..................... 430/22
6,379,867 B1 * 4/2002 Mei et al. ................... 430/296

FOREIGN PATENT DOCUMENTS

| JP | Hei 08-097119 A | 4/1996 |
| JP | Hei 09-148223 A | 6/1997 |

* cited by examiner

Primary Examiner—Christopher G. Young
(74) Attorney, Agent, or Firm—Westerman, Hattori, Daniels & Adrian, LLP (57) ABSTRACT A pattern forming method comprising the steps of: detecting a position of a base pattern formed on a substrate; forming a photosensitive resin film on the substrate; correcting a pattern data of a pattern to be formed on the substrate, based on a positional information of the base pattern to thereby compute a corrected pattern data; displaying a mask pattern on a liquid crystal panel, based on the corrected pattern data; and exposing the photosensitive resin film with the liquid crystal panel as a mask and developing the same to thereby pattern the photosensitive resin film. Even when a base pattern has rotations, shrinkages, distortions, etc., a prescribed upper layer pattern can be formed in alignment with the lower layer pattern.

14 Claims, 6 Drawing Sheets

PATTERN FORMING METHOD

CROSS-REFERENCE TO RELATED APPLICATIONS

This application is based upon and claims the benefit of priority from the prior Japanese Patent Application No. 2001-384297, filed in Dec. 18, 2001, the entire contents of which are incorporated herein by reference.

BACKGROUND OF THE INVENTION

The present invention relates to a pattern forming method, more specifically to a pattern forming method suitable for forming a multi-level interconnection layer on a substrate with LSI chips embedded in.

With requirements of higher performance and smaller sizes of electronic equipments, input and output densities of semiconductor devices are on increase. It is proposed to use, as LSI packages, packages, such as CSP (Chip Size Package) and wafer-level CSP, etc., which can be smaller-sized. As substrates for these small-size packages to be mounted on, multi-layered resin substrates formed of plurality of interconnection layers and resin insulating layers alternately laid one on the other are proposed.

Recently is proposed a method in which a multi-level interconnection layer is formed on a substrate with LSI chips embedded in instead of mounting LSI chips onto a package substrate in the above-described method. The package substrate prepared by this method has advantages of small inductances and decreasing stresses generated by heat. A further advantage is that interconnections can be increased, and various electronic and optical devices, such as logic LSI, memory LSI, RF, MEMS (micro electromechanical systems), etc., can be built in. Furthermore, the package substrate has higher interconnection freedom and good electric power supply performance, and is suitable to incorporate inter-layer dielectric material of low dielectric constant.

Figure 6A:
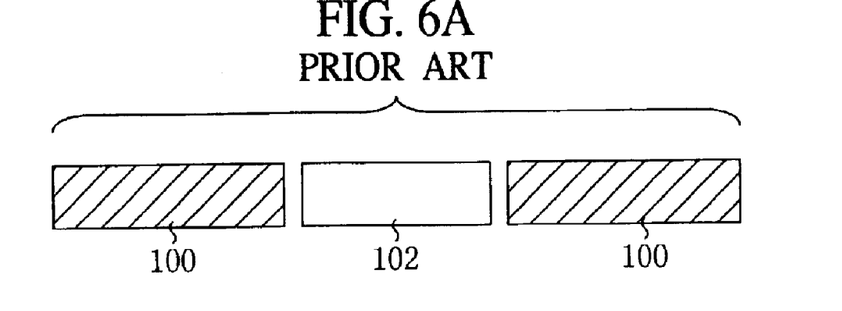
FIGS. 6A–6C are sectional views of the conventional package substrate in the steps of the method for fabricating the same, which explain the method.

Then, the method for fabricating the conventional package substrate, in which a multi-level interconnection layer is formed on a substrate with LSI chips embedded in will be explained with reference to FIGS. 6A–6C.

LSI chip 102 is embedded in a mold frame of a core substrate 100 of BT (bismaleimide triazine) resin, etc. (FIG. 6A).

Figure 6B:
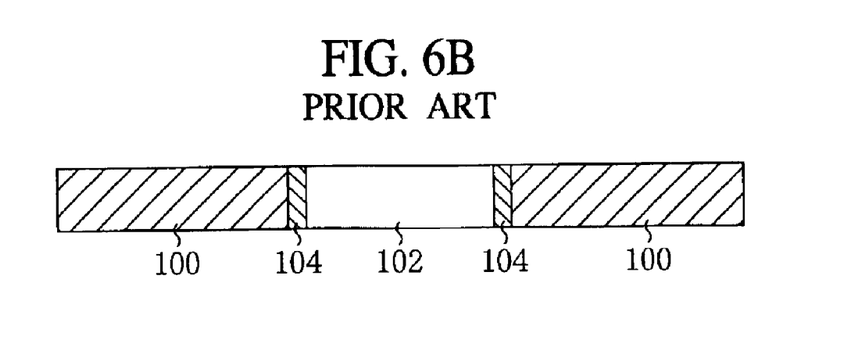

Next, a sealing resin 104 is filled into the gaps between the core substrate 100 and the LSI chip 102 to thereby secure the LSI chip 102 to the core substrate 100 (FIG. 6B).

Figure 6C:
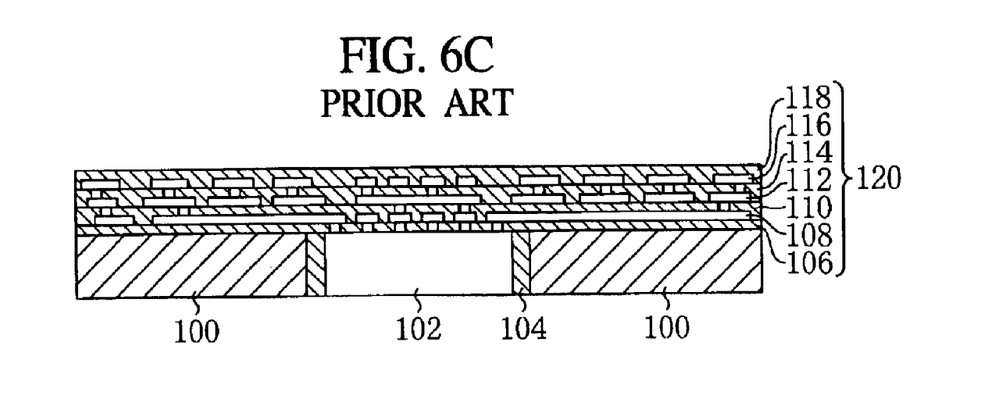

Then, on the core substrate 100 with the LSI chip 100 embedded in, insulating layers 106, 110, 114, 118 and interconnection layers 108, 112, 116 are alternately laid into a multi-level interconnection layer 120 in the same way as in the method for forming a built-up layer in the conventional packaging technique (FIG. 6C).

The package substrate with the multi-level interconnection layer 120 connected to the LSI chip 102 can be thus formed on the core substrate 100.

However, according to the above-described method for fabricating the conventional package substrate, in which a multi-level interconnection layer is formed on a substrate with LSI chip embedded in, a plurality of LSI chips embedded in a core substrate are often independently disaligned. In such case, patterning of via holes and interconnection layers by using a glass mask or a reticle with a prescribed pattern formed on cannot form the multi-level interconnection layer in accurate alignment with the respective LSI chips.

This has required very high alignment accuracy in arranging the LSI chips. Higher accuracy for the alignment is required for a larger number of LSI chips, which makes it difficult to control the alignment accuracy.

Even when LSI chips are secured to a core substrate with high alignment accuracy, the alignment accuracy is often degraded due to a thermal expansion coefficient difference with respect to the sealing resin.

In forming a multi-level interconnection layer, when pattern distortions and shrinkages take place due to thermal processing, it often makes it difficult to align a pattern of a layer to be formed thereon.

SUMMARY OF THE INVENTION

An object of the present invention is to provide a pattern forming method which, in forming a multi-level interconnection layer on a substrate with LSI chips embedded in, enables a prescribed pattern of an upper layer to be formed even when disalignments, rotations, shrinkages, distortions, etc. take place in a lower layer.

According to one aspect of the present invention, there is provided a pattern forming method comprising the steps of: detecting a position of a base pattern formed on a substrate; forming a photosensitive resin film on the substrate; correcting a pattern data of a pattern to be formed on the substrate, based on a positional information of the base pattern to thereby compute a corrected pattern data; displaying a mask pattern on a liquid crystal panel, based on the corrected pattern data; and exposing the photosensitive resin film with the liquid crystal panel as a mask and developing the same to thereby pattern the photosensitive resin film.

According to another aspect of the present invention, there is provided a pattern forming method comprising the steps of: securing an LSI chip to a core substrate; detecting a position of the LSI chip with respect to the core substrate; forming a photosensitive resin film on the core substrate with the LSI chip secured to; correcting a pattern data of a pattern to be formed on the core substrate, based on a detected positional information of the LSI chip to thereby compute a corrected pattern data; displaying a mask pattern on a liquid crystal panel, based on the corrected pattern data; and exposing the photosensitive resin film with the liquid crystal panel as a mask and developing the same to thereby pattern the photosensitive resin film.

According to the present invention, positions of the LSI chips with respect to the core substrate are detected, the pattern data for a pattern to be formed on the core substrate is corrected based on positional information of the LSI chips, a mask pattern based on the corrected pattern data is displayed on a liquid crystal panel, and the pattern is formed by lithography with the liquid crystal panel as a mask, whereby even when the LSI chips are disaligned with the core substrate, the multi-level interconnection layer can be formed on the core substrate accurately in alignment with the LSI chips.

DETAILED DESCRIPTION OF THE INVENTION

The pattern forming method according to one embodiment of the present invention will be explained with reference to FIGS. 1A–1E, 2A–2E, 3A–3B, 4 and 5A–5B.

Figure 3A:
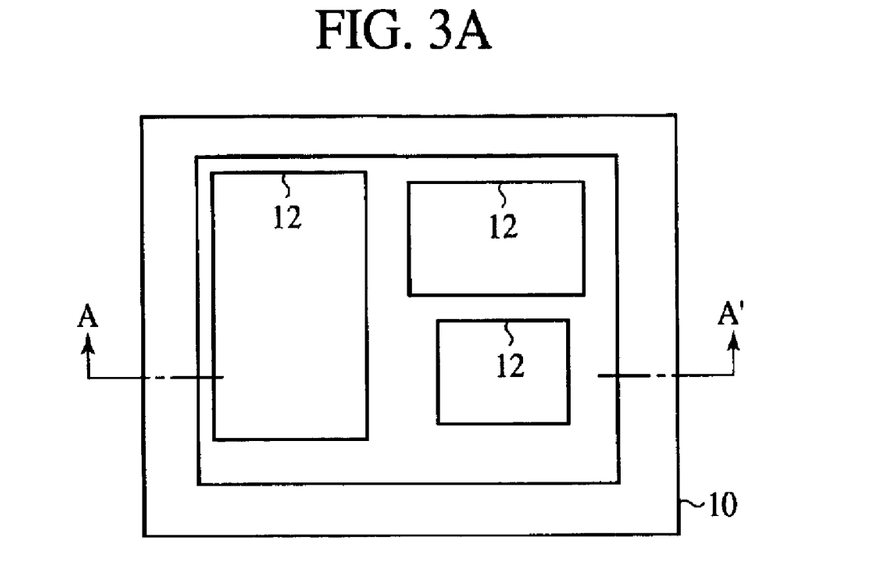
FIGS. 3A and 3B are plan views showing the pattern forming method according to the embodiment of the present invention.
Figure 3B:
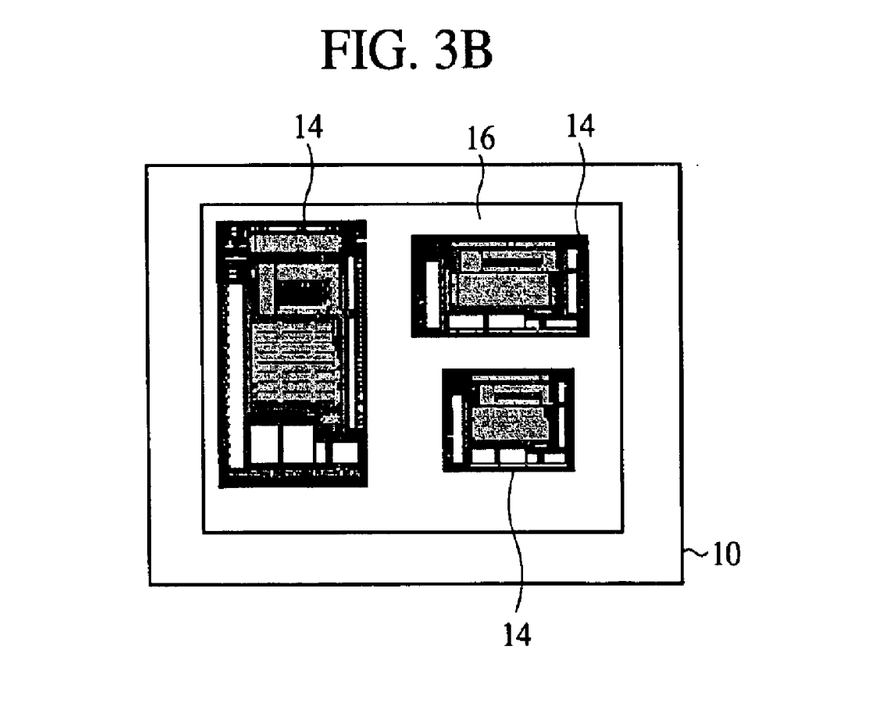
Figure 4:
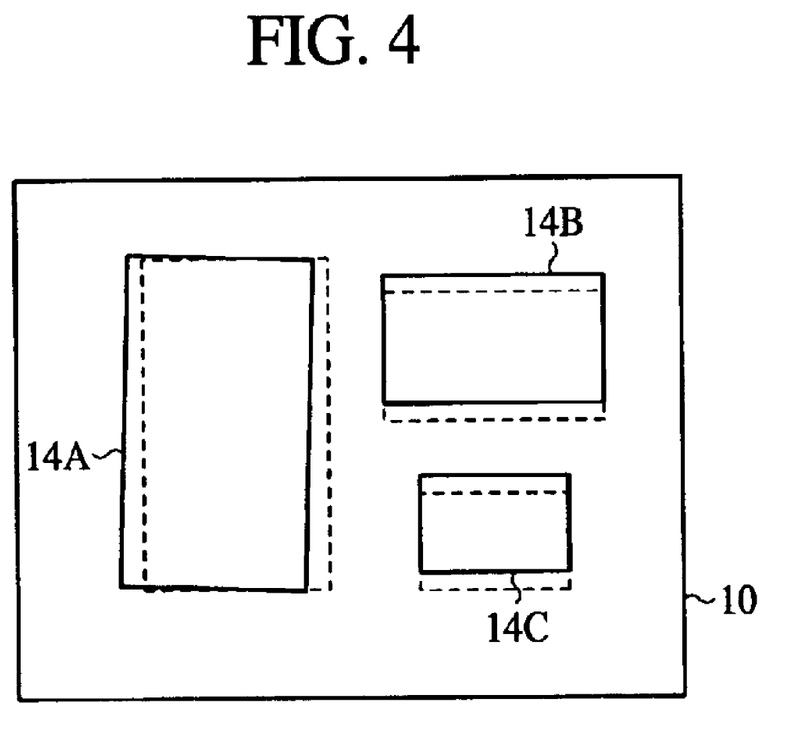
FIG. 4 is a plan view showing one example of disalignment of LSI chips.
Figure 5A:
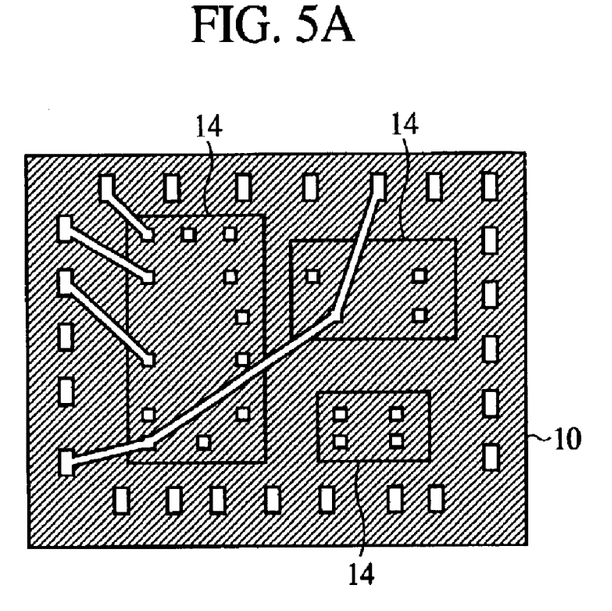
FIGS. 5A and 5B are plan views of one example of a basic mask pattern of an interconnection layer and the mask pattern as corrected.
Figure 5B:
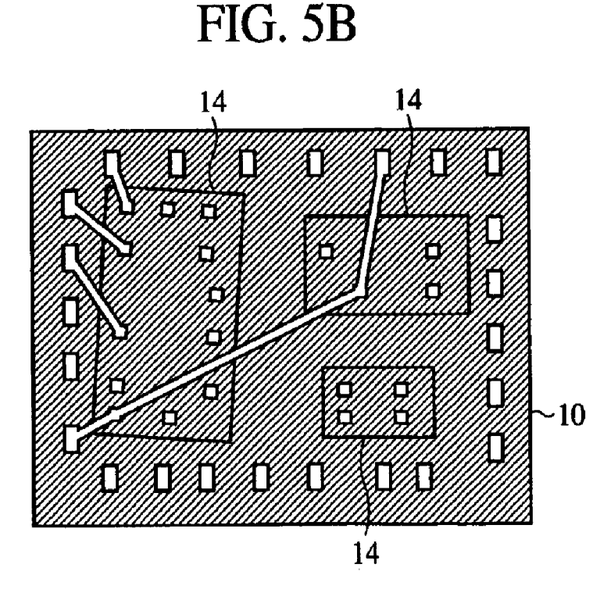

FIGS. 1A–1E and 2A–2E are sectional views of a package substrate in the steps of the pattern forming method according to the present embodiment, which explain the method. FIGS. 3A and 3B are plan views showing the pattern forming method according to the present embodiment. FIG. 4 is a plan view showing one example of disalignment of LSI chips. FIGS. 5A and 5B are plan views of one example of a basic mask pattern and the mask pattern as corrected.

Figure 1A:
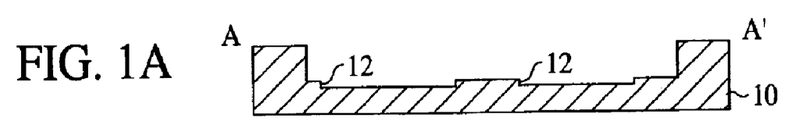
FIGS. 1A–1E and 2A–2E are sectional views of a package substrate in the steps of the pattern forming method according to one embodiment of the present invention, which explain the method.

Grooves 12 for a plurality of LSI chips to be embedded in are formed in a core substrate 10 to be the base (FIG. 1A, FIG. 3A). In place of forming the grooves 12, a core substrate with mold frames for the LSI chips to be embedded in may be used.

Figure 1B:
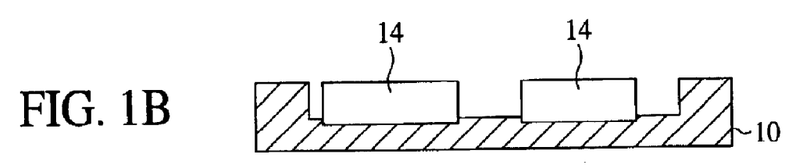

Then, LSI chips 14 are fit in the grooves 12 formed in the core substrate 12 and secured with a resin (FIG. 1B). The LSI chips are embedded with the circuit surfaces thereof faced upward. Preferably, the resin is set by pressing the surfaces of the LSI chips 14 with a parallel plate, so that the circuit surfaces of the LSI chips 14 can be flush with the level of a height of the core substrate 10.

Figure 1C:
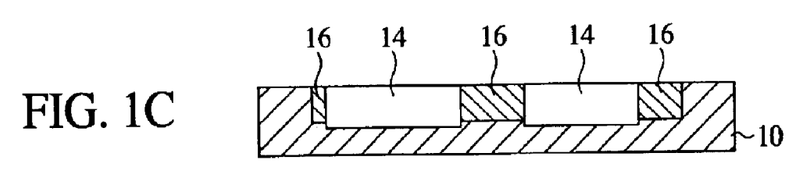

Next, a resin 16 is filled in the gaps between the LSI chips 14 without adhering the resin 16 to the circuit surfaces of the LSI chips 14 to thereby make the surface flat (FIG. 1C, FIG. 3B). At this time, there is a risk that the respective LSI chips 14 may be disaligned due to alignment accuracy when the LSI chips 14 are secured to the core substrate 10 and stresses produced when the resin 16 is dried. The disalignment will include x-axial disalignment, y-axial disalignment, rotations, etc.

FIG. 4 shows an image in which the LSI chip 14A has a disalignment containing rotation, and the LSI chip 14B and the LSI chip 14C have y-axial disalignments. In FIG. 4, the dotted lines indicate the basic positions of the LSI chips 14, and the solid lines indicate positions where the LSI chips 14 have been actually located.

Figure 1D:
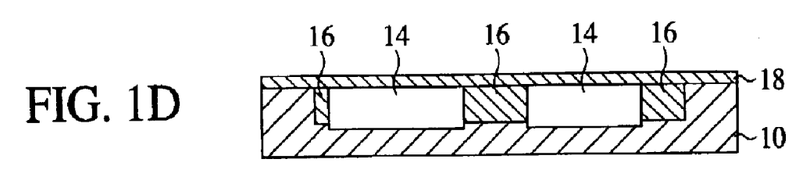

Then, a photosensitive dielectric resin 18 is applied to the core substrate 10 with the LSI chips 14 embedded in, and dried (FIG. 1D).

Thus, a base pattern formed by the LSI chips 14 is formed on the core substrate 10. The base pattern is a pattern including a tetragonal shape, a polygonal shape, etc. which is formed over the core substrate 10. At least one interconnection layer is to be formed on the base pattern. In the present embodiment, outline shapes of the LSI chips 14 correspond to the base pattern.

Next, relative positions of the respective LSI chips 14 with respect to the core substrate 10 are detected by optical means. The positions of the LSI chips 14 may be detected by detecting the edges of the LSI chips 14 or alignment marks on the LSI chips 14.

Then, based on the detected positional information of the LSI chips 14, positions of the electrodes (not shown) formed on the LSI chips 14 are computed. For the computation, positional relationships between the edges of the LSI chips 14 and the electrodes or positional relationships between the alignment marks and the electrodes are beforehand in storage means, so that positions of the electrodes of the LSI chips 14 are computed, based on the stored information.

Next, based on the computed positional information of the electrodes of the respective LSI chips, basic pattern data of via holes, which has been in advance stored in the storage means is corrected to compute corrected pattern data. The basic pattern data is pattern data of idealistic locations of the LSI chips 14 without disalignments. The corrected pattern data is a pattern data of the basic pattern which has been corrected so that positions of the respective via holes are above the electrodes of the actual LSI chips.

For example, in a case that the basic pattern data of the via holes is based on coordinate origins of the respective vial holes, the coordinate origins of the respective via holes are shifted by amounts corresponding to disalignment amounts of the LSI chips to thereby produce the corrected pattern data.

Then, based on the thus-computed corrected pattern data of the via holes, a mask pattern is produced and displayed on a liquid crystal panel.

Next, with the liquid crystal panel displaying the mask pattern as a mask, the photosensitive dielectric resin 18 is exposed and developed. The liquid crystal panel is thus used as a mask to thereby prepare mask patterns corrected suitably corresponding to disalignments of the LSI chips 14.

Figure 1E:
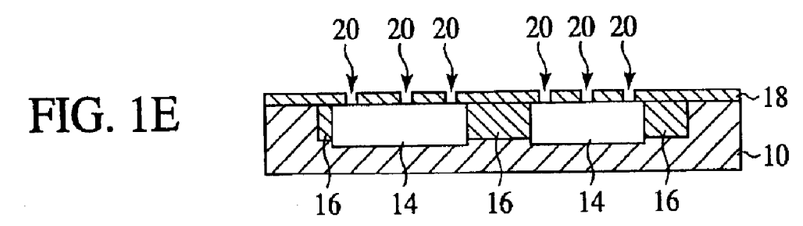

Thus, via holes 20 are formed in the photosensitive dielectric resin 18 in alignment with the positions of the electrodes of the respective LSI chips 14 (FIG. 1E). The photosensitive dielectric resin 18 is to be an inter-layer insulating film for insulating the interconnection layers.

Figure 2A:
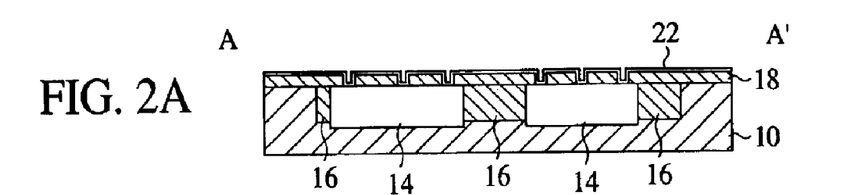

Then, a titanium nitride film, for example, is deposited on the entire surface to form a barrier metal layer 22 of the titanium nitride film (FIG. 2A).

Next, a photoresist film 24 is applied to the barrier metal layer 22 and dried.

Then, based on the computed positional information of the electrodes of the LSI chips 14, basic pattern data of an interconnection layer, which has been beforehand stored in the storage means is corrected to compute corrected pattern data. Here, the basic pattern data is idealistic pattern data of the LSI chips 14 without disalignments. The corrected pattern data is a pattern data of the basic pattern which has been corrected so that contact positions of the respective interconnections are above the via holes 20 formed in the photosensitive dielectric resin 18.

For example, in a case that the basic pattern of the interconnection layer is based on coordinate origins of the respective via holes 20, the corrected pattern data can be produced, based on coordinate origins of the via holes 20, which have been corrected in consideration of the positional information of the LSI chips.

Then, based on the thus computed corrected pattern data of the interconnection layer, the mask pattern is produced and displayed on a liquid crystal panel. At this time, when the photoresist film 24 is provided by a positive resist, the mask pattern is formed on the liquid crystal panel so that a region for the interconnection layer to be formed in is a transmitting region. FIG. 5A shows one example of the mask pattern formed based on the basic pattern data, and FIG. 5B shows one example of the mask pattern formed based on the corrected pattern data.

When the basic pattern of the interconnection layer is corrected, it is preferable to suitably adjust a width of the interconnection so as not to change the width of the interconnection. Especially, there is a risk that the breakage of the equipment or obstruction of the normal circuit operation is occurred because of exceeding the upper limit of the current density when the width of the interconnection narrows, so that it is effective to suitably adjust the width of the interconnection.

Figure 2B:
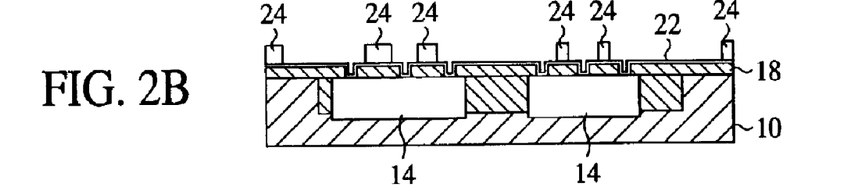

Then, with the liquid crystal panel displaying the mask pattern as a mask, the photoresist film 24 is exposed and developed. Thus, the photoresist film 24 in the region for the interconnection layer to be formed in is selectively removed (FIG. 2B).

Figure 2C:
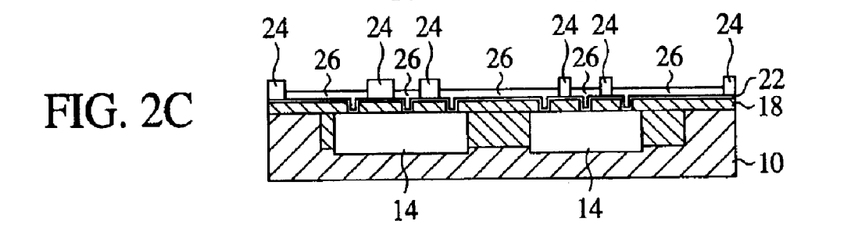

Next, with the photoresist film 24 formed, copper, for example, is deposited by plating with the barrier metal layer 22 as a seed layer to form a copper film 26 selectively in the region for the interconnection layer to be formed in (FIG. 2C).

Figure 2D:
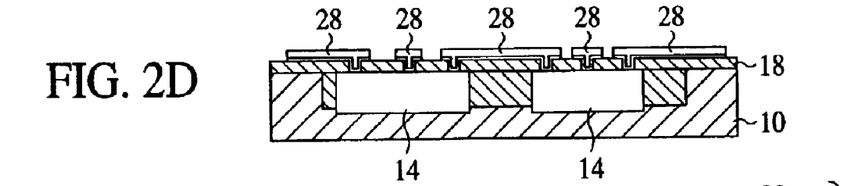

Then, after the photoresist film 24 has been removed, with the copper film 26 as a mask, the barrier metal layer 22 is etched off to form the interconnection layer 28, etc. of the barrier metal layer 22 and the copper layer 26 laid the one on the other (FIG. 2D).

Figure 2E:
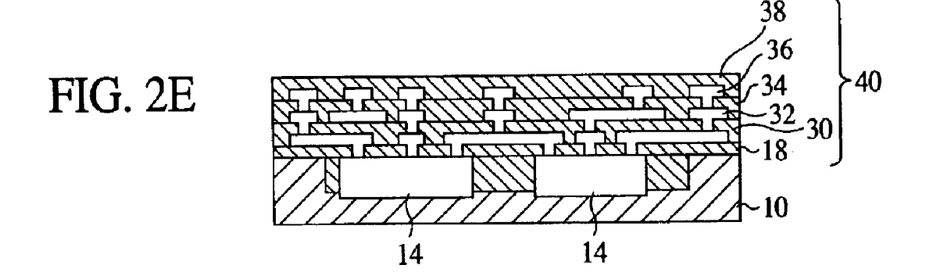

Next, in the same way as in the steps of, e.g., FIGS. 1D to 2D, on the photosensitive dielectric resin with the interconnection layer formed on, photosensitive dielectric resins 30, 34, 38, etc. and interconnection layers 32, 36, etc. are repeated formed to thereby form a multi-level interconnection layer 40 on the core substrate 10 (FIG. 2E)

As described above, according to the present embodiment, positions of the LSI chips with respect to the core substrate are detected, the pattern data for a pattern to be formed on the core substrate is corrected based on positional information of the LSI chips, a mask pattern based on the corrected pattern data is displayed on a liquid crystal panel, and the pattern is formed by lithography with the liquid crystal panel as a mask, whereby even when the LSI chips are disaligned with the core substrate, the multi-level interconnection layer can be formed on the core substrate accurately in alignment with the LSI chips.

In the present embodiment, the patterning is performed in the process of forming the multi-level interconnection layer 40 by using information of positions of the electrodes of the LSI chips 14. However, it is possible that positions of the via holes or the interconnection layer formed on the core substrate 10 are detected to obtain new positional information, and based on the positional information, the patterning of the upper layers is performed. In the latter, the multi-level interconnection layer 40 can be formed while not only disalignments of the LSI chips 14, but also distortions and shrinkages of patterns taking place in processes, as of thermal processing, etc., are corrected.

In the present embodiment, positions of the LSI chips are detected after the photosensitive dielectric resin 18 has been applied to, but the positional detection of the LCI chips may be performed before the application of the photosensitive dielectric resin 18. When positions of the LSI chips are detected, the entire surface region of the core substrate is divided in a plurality of units, and the positional detection of the LSI chips may be performed for the respective units.

In the present embodiment, the present invention has been explained by means of the example that the multi-level interconnection layer is formed on the core substrate with the LSI chips embedded in. However, the present invention is not limited to the process of fabricating package substrates and is applicable widely to the formation of patterns by photolithography. The present invention is advantageously applicable especially to cases where different factors for disalignment are present in one and the same plane and where distortion and shrinkage take place due to build-up, etc.

The base pattern is not limited to a pattern formed on the core substrate 10. As described above, a pattern formed by the interconnection layer formed on the core substrate 10, etc. may be also included in the base pattern.

What is claimed is:

1. A pattern forming method comprising the steps of:
    detecting a positional information of a first pattern formed on a substrate;
    forming a photosensitive resin film on the substrate;
    correcting a basic pattern data of a second pattern to be formed on the substrate with the first pattern formed on, based on a the detected positional information of the first pattern to thereby compute a corrected pattern data of the second pattern;
    displaying a mask pattern on a liquid crystal panel, based on the corrected pattern data; and
    exposing the photosensitive resin film with the liquid crystal panel as a mask and developing the same to thereby pattern the photosensitive resin film.

2. A pattern forming method according to claim 1, wherein
    in the step of detecting the positional information of the first pattern, a disalignment amount, a rotation amount and/or a shrinkage amount with respect to a basic position of the first pattern are detected.

3. A pattern forming method comprising the steps of:
    securing an LSI chip to a core substrate;
    detecting a positional information of the LSI chip with respect to the core substrate;
    forming a photosensitive resin film on the core substrate with the LSI chip secured to;
    correcting a basic pattern data of a pattern to be formed on the core substrate with the LSI chip secured thereto, based on the detected positional information of the LSI chip to thereby compute a corrected pattern data of the pattern to be formed on the core substrate with the LSI chip secured thereto;
    displaying a mask pattern on a liquid crystal panel, based on the corrected pattern data; and
    exposing the photosensitive resin film with the liquid crystal panel as a mask and developing the same to thereby pattern the photosensitive resin film.

4. A pattern forming method according to claim 3, wherein
    in the step of securing LSI chip, plurality of LSI chips are secured to the core substrate;
    in the step of detecting the positional information of the LSI chip, positions of the respective LSI chips are separately detected; and
    in the step of computing the corrected pattern data, the corrected pattern data is computed based on the detected positional information of the LSI chips.

5. A pattern forming method according to claim 3, wherein
    in the step of computing the corrected pattern data, the pattern data is corrected so that a pattern size of the pattern to be formed on the core substrate is not changed.

6. A pattern forming method according to claim 5, wherein the pattern is a pattern of an interconnection, and the pattern size is a width of the interconnection.

7. A pattern forming method according to claim 4, wherein in the step of computing the corrected pattern data, the pattern data is corrected so that a pattern size of the pattern to be formed on the core substrate is not changed.

8. A pattern forming method according to claim 7, wherein the pattern is a pattern of an interconnection, and the pattern size is a width of the interconnection.

9. A pattern forming method according to claim 3, wherein in the step of detecting the positional information of the LSI chip, a disalignment amount and/or a rotation amount of the LSI chip with respect to a basic position of the LSI chip are detected.

10. A pattern forming method according to claim 4, wherein in the step of detecting the positions of the LSI chips, disalignment amounts and/or rotation amounts of the LSI chips with respect to a basic position of the LSI chips are detected.

11. A pattern forming method according to claim 3, wherein in the step of detecting the positional information of the LSI chip, a relative positional relationship of an edge of the LSI chip with respect to the core substrate is detected.

12. A pattern forming method according to claim 4, wherein in the step of detecting the positions of the LSI chips, relative positional relationships of edges of the LSI chips with respect to the core substrate are detected.

13. A pattern forming method according to claim 3, wherein in the step of detecting the positional information of the LSI chip, a relative positional relationship of an alignment mark on the LSI chip with respect to the core substrate is detected.

14. A pattern forming method according to claim 4, wherein in the step of detecting the positions of the LSI chips, relative positional relationships of alignment marks on the LSI chips with respect to the core substrate are detected.

* * * * *